United States Patent [19]
Brickman et al.

[11] 4,025,909
[45] May 24, 1977

[54] SIMPLIFIED DYNAMIC ASSOCIATIVE CELL

[75] Inventors: Norman Frederick Brickman; Joseph Carl Logue, both of Poughkeepsie, N.Y.

[73] Assignee: IBM Corporation, Armonk, N.Y.

[22] Filed: Sept. 8, 1975

[21] Appl. No.: 611,361

[52] U.S. Cl. .......................... 340/173 FF; 307/238; 340/173 SP

[51] Int. Cl.² ...................................... G11C 11/44

[58] Field of Search .............. 307/238; 340/173 FF, 340/173 AM, 173 SP

[56] References Cited
UNITED STATES PATENTS

| | | | |
|---|---|---|---|
| 3,618,052 | 11/1971 | Kwei | 340/173 SP |
| 3,678,475 | 7/1972 | Jordan et al. | 307/238 |
| 3,735,358 | 5/1973 | Ho | 340/173 SP |
| 3,760,378 | 9/1973 | Burns | 307/238 |

Primary Examiner—Marshall M. Curtis
Attorney, Agent, or Firm—James E. Murray

[57] ABSTRACT

This specification describes an associative memory cell capable of performing logic functions. The cell comprises two transistors with their collectors connected to an output line; with their emitters either left floating or connected to an input line carrying either true or complement of one variable; and with their bases either connected to an input line carrying the true or complement of a second variable or to the output line which is maintained at a fixed potential. This permits the performing of sixteen different logic functions of the two input variables by the cell.

8 Claims, 2 Drawing Figures

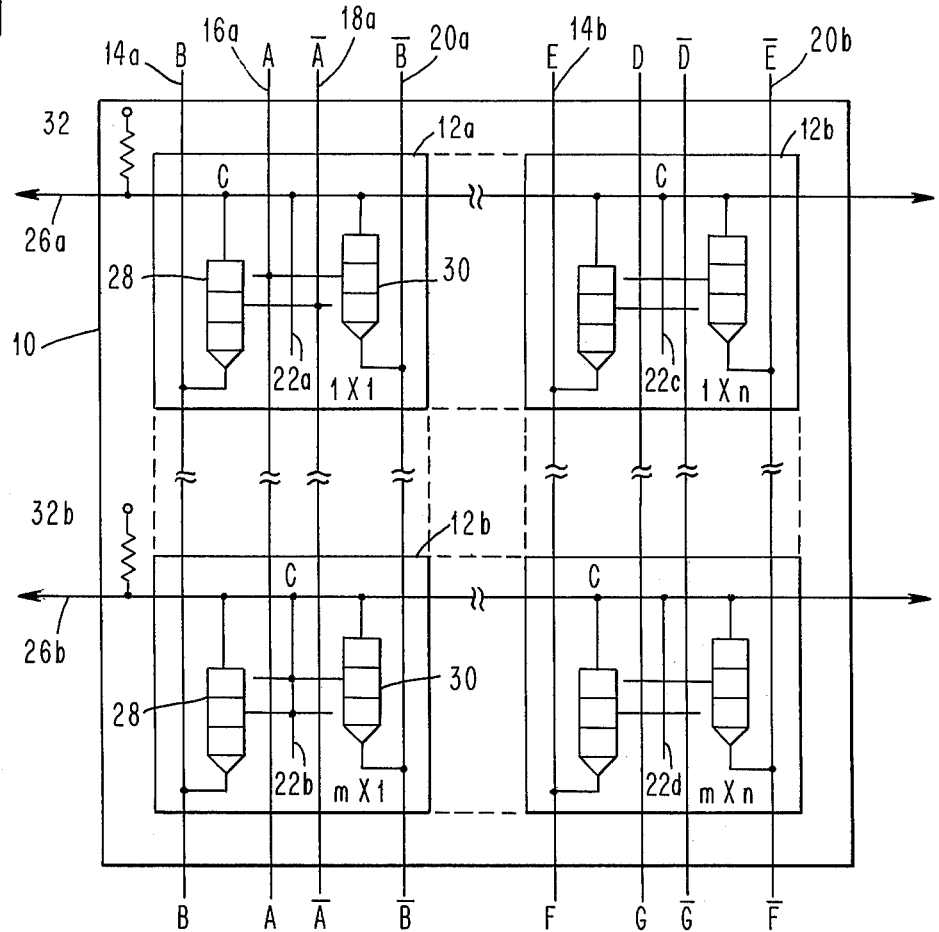

SIMPLIFIED DYNAMIC ASSOCIATIVE CELL

BACKGROUND OF THE INVENTION

This invention relates to array logic and more particularly to cells on such memories which will perform logic functions within the array.

It has been suggested in the past to use multi-state cells to perform logic in either associative or random access arrays. In Gardner et al U.S. Pat. No. 3,543,296 a functional memory employing four state cells is illustrated. These cells are each addressed by a single binary input which is complemented and fed through a mask to the balance bit lines of each cell so as to interrogate the cell for match or no match conditions. With this cell it is possible to store one of four possible states of information; three of which are decipherable in the associative memory configuration. In other words, with a cell in anyone of three of the states it is possible to obtain a match condition when that cell is interrogated through the unmasked bit lines of the memory while it is impossible to obtain a match condition if the cell is in the fourth state when it is so interrogated. The three states which are decipherable are called the "zero", the "one" and the "X" or "Don't Care" states. The fourth state or the undecipherable state is referred to as the "Y" state.

Logic is being performed when one of these cells is interrogated for its logic state. Thus the functional memory in the Gardner et al patent is capable of performing logic. However, because only three of four logic states of each cell are decipherable by the configuration, twenty-five percent of the logic power of the array is lost. Furthermore, the four state associative cell configuration can only perform very simple logic functions and to perform higher order logic functions such as an Exclusive OR function requires additional logic circuitry at the output of the memory and/or additional words in the memory. Fleisher et al U.S. Pat. No. 3,593,317 described a technique using decoders to perform high order logic in ordered arrays and the Weinberger U.S. Pat. No. 3,761,902 applies this technique to functional memories to increase the logic power of such functional memories by minimizing undecipherable states and permitting the performance of higher order logic functions. In the Fleisher et al and Weinberger patents the multiple state cells are either a single multiple state cell or a plurality of bi-stable or quadra-stable cells which are addressed through their bit lines by a decoder for decoding two or more data bits and provide logic results on their output lines. For instance, where a state cell is used only one of the 16 possible states is undecipherable instead of one out of four in the four state cells discussed above. Furthermore, it is possible to perform higher order logic functions such as the Exclusive OR function by using decoders as described in the Fleisher et al and Weinberger patents.

In co-pending application Ser. No. 578,300, filed May 16, 1975, J. W. Jones, "Dynamic Associative Cell", it is suggested that a multiple state logic cell can perform higher order logic functions of the Fleisher et al and Weinberger patents within the array proper and without the use of the multiple bit decoders employed in those patents. The difficulty with this cell is that it requires six input lines; two to carry positive/negative potentials. These input lines require much space on a monolithic chip; therefore, decreasing the density that the cells can be arranged on the chip.

BRIEF DESCRIPTION OF THE INVENTION

In accordance with the present invention a new multiple state logic cell is provided which is capable of performing the same logic functions as the cell in the heretofore described patent application. This cell comprises two transistors with their collectors connected to an output line with their emitters either left floating or connected to an input line carrying either true or complement of one variable, and with their bases either connected to the true or complement of the second variable or to the output line which is maintained at a fixed potential. As can be seen it eliminates the need for two of the input lines of the cell. That is, the ones that carry the fixed positive and negative potentials to the cell.

Therefore, it is an object of the present invention to provide a new functional memory cell.

It is an object of the present invention to provide a simpler functional memory cell with increased logic power.

It is another object of the invention to provide a new logic performing cell.

It is a further object of the invention to provide a logic performing cell of increased logic power and simpler configuration.

THE DRAWINGS

The above and other objects, features and advantages of the invention will be apparent from the preferred embodiment of the invention illustrated in the accompanying drawings of which:

FIG. 1 is an array containing storage cell of the present invention.

FIG. 2 is a truth table for the storage cells shown in the array of FIG. 1.

DETAILED DESCRIPTION

FIG. 1 shows an array 10 of cells 12 arranged in n columns by m rows of cells 12. Each column of cells 12 is addressed through four input lines 14, 16, 18, and 20 and each row of cells is addressed by one output line 26. In each cell 12 there are two transistors 28 and 30 with their collectors both connected to the output line 26 and their emitters either left floating or coupled to one of the input lines 14 or 20. The bases of the transistors 28 and 30 are selectively connected to any one of the other two input lines 16, 18 or to the output line. The two input lines 16 and 18 carry the true and complement of a second input transistor 28 or 30 variable. It will be noted that coupling the base of either to one of the word lines 26 shorts out the base to collector function of that transistor.

Each word line 26a is connected to a positive source through a resistor 32 so that any transistor 28 and 30 will be rendered conductive and produce a low logic level on the output line 26 connected to its collector when the emitter of that transistor 28 or 30 is at a down logic level at the same time the base of that transistor is at an up logic level. If none of the transistors 28 and 30 connected to a given output line 26 are so biased then the output line will be at an up logic level.

There are 16 different possible combinations of connections which can be made to the bases of the two transistors 28 and 30, with each combination giving a different binary logic function of the two input variables applied to the lined 14, 16, 18 and 20 respectively. FIG. 2 is a truth table showing each of these logical functions. The row legends along the left hand edge of the truth table are the possible connections to the left hand transistor 28 while the column legends at the top of the truth table are the possible connections to the right hand device 30. The statement contained in each box is the logical function that will be performed by a cell when the devices 28 and 30 of the cell are connected as indicated by the row and column legends of the box. Therefore, if as shown the emitters of transistors 28 and 30 in cell 12a are connected respectively to line 14a and 20a carrying the true and complement of one cariable B, an the bases of the transistor 28 and 30 are connected to the input lines 16a and 20a carrying the true and complement of a second variable B, then the signal on the output line 26a will be the Exclusive OR function of the two input variables A and B. Another example as shown in cell 12b would be if gates of both transistors 28 and 30 are connected to the line 22b containing the fixed up level as illustrated in cell 12b we obtain a false function of the input variable B or B̄ on the output line 26b. Therefore it should be apparent that with each different combination of connections a different one of the functions in the boxes of the table of FIG. 2 will be performed.

The base of each of the transistors 28 and 30 is connected to a line 34 or 36 arranged transverse to and intersecting each of its input lines. The lines are arranged on opposite sides of an insulating layer on the surface of the monolithic chip containing the array. For instance the output lines 26 and the transverse lines 34 and 36 could be diffused lines in the surface of the chip and the input lines 14 to 24 could be metal lines on the surface of an insulating layer on top of that surface of the chip. Connections between lines 16 to 24 and lines 34 and 36 can be made through holes in the insulating layer. Alternatively the lines can be arranged and fabricated as the addressing grid described in Cox et al application Ser. No. 537,219, filed Dec. 30, 1974.

The arrays shown in FIG. 1 can be compounded as shown in the above mentioned Cox et al application or in Weinberger application Ser. No. 537,217, filed Dec. 30, 1974 with the outputs of one array feeding inputs to another array. Furthermore, the input lines and output lines of the array may be broken as described in the above mentioned Weinberger and Cox applications so that more than one logic function can be performed on a given row or column of the array. For instance, the output line 26a could be split so that a function of input variables A and B could be performed in cell 12a and the result placed in the left hand segments of line 26a while a different function involving variables D and E can be performed by cell 12c and the resultant placed on the right hand segment of line 26a. Likewise the lines 14 can be split. For instance, lines 14 through 22b can be split so that input variables D and E can be used to generate functions along the upper segments of those lines while variables F and G can be used to form variables on the lower segments of those lines.

Obviously many other changes could be made by those skilled in the art. Therefore, it should be understood that the above and other changes in form and details may be made therein without departing from the spirit and scope of the invention.

What is claimed is:

1. In an array for performing logic functions having a storage cell with two, three terminal semiconductive devices; an output line to a first terminal of both the transistors, and coupled through a load device to a source of potential; at least four input lines for carrying the true and complement of at least two input variables; and connection means for coupling a second terminal of each of the semiconductive devices to a different one of the input lines, the improvement in the storage cell comprising a connection coupling the third terminal of at least one of the semiconductive devices to the output line to perform logic functions of one or more of the variables on the input lines.

2. The storage cell of claim 1 wherein the devices have a control terminal and two controlled terminals wherein one of the controlled terminals of both of the semiconductive devices is coupled to the ouput line, the other of the controlled terminals of both semiconductive devices is either open or coupled to one of the input lines carrying either the true or complement of one of the input variables and the control terminal of one of the semiconductive devices.

3. The storage cell of claim 2 wherein said semiconductive devices are transistors and the first controlled terminal is the collector, the second controlled terminal is the emitter and the control terminal is the base.

4. The storage cell of claim 1 including a connection means for coupling the third terminal of the other of said semiconductive devices to one of the input lines other than the two coupled to the second terminals of the semiconductive devices.

5. The storage cell of claim 1 including a connection coupling the third terminal of the other of the semiconductive devices to the output line.

6. An array for performing logic functions comprising,
a plurality of sets of input lines for carrying both the true and complement of at least two input variables,
a plurality of output lines intersecting said sets of input lines,
reference potential means coupled to the output line at the intersections of an output line with a plurality of input lines,
no more than a pair of three terminal semiconductive devices located at each of said intersections,
coupling means at said intersections for coupling the first terminal of each of said semiconductive devices in the pair to the output line, the second terminal of one of the two semiconductive devices to an input line, the second terminal of the other of the two semiconductive devices to another input line and second connection means at said intersections for connecting the third terminal of one of the two semiconductive devices to the output line and the third terminal of the other of the semiconductive devices means to one of the input lines not connected to a first terminal of one of the semiconductive devices or to the output line to perform a logic function determined by the second connection means involving the one or both of the input variables on the set of input lines passing through the intersection.

7. The storage cell of claim 6 wherein the devices have a control terminal and two controlled terminals wherein one of the controlled terminals of both of the semiconductive devices is coupled to the output line, the other of the controlled terminals of both semiconductive devices is either open or coupled to one of the input lines carrying either the true or complement of one of the input variables and the control terminal of one of the semiconductive devices.

8. The storage cell of claim 6 wherein said semiconductive devices are transistors and the first controlled terminal is the collector, the second controlled terminal is the emitter and the control terminal is the base.

* * * * *